(12) United States Patent
Fan

(10) Patent No.: US 6,169,490 B1
(45) Date of Patent: Jan. 2, 2001

(54) OUTLET PORT PROTECTIVE DEVICE FOR STOCKING UNIT

(75) Inventor: Denis Fan, Miaoli Hsien (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/531,983

(22) Filed: Mar. 20, 2000

(51) Int. Cl.⁷ ..................................................... G08B 21/00
(52) U.S. Cl. ................. 340/686.6; 340/673; 250/859.12; 250/559.29; 250/559.4; 414/937; 414/940
(58) Field of Search ..................................... 340/540, 555, 340/556, 557, 673, 686.1, 686.6; 250/559.04, 559.09, 559.12, 559.29, 559.36, 559.4; 414/935, 937, 940

(56) References Cited

U.S. PATENT DOCUMENTS

| 4,682,928 | * | 7/1987 | Foulke et al. | .......................... | 414/416 |
| 5,319,216 | * | 6/1994 | Mokuo et al. | ......................... | 250/561 |
| 5,655,871 | * | 8/1997 | Ishii et al. | .............................. | 414/416 |

* cited by examiner

Primary Examiner—Daniel J. Wu
(74) Attorney, Agent, or Firm—J. C. Patents; Jiawei Huang

(57) ABSTRACT

An installation for protecting the outlet port of a stocking unit. The installation includes an outlet port having four wafer boat supporters, two wafer boat sensors and a set of light-intercepting sensors. Through the light-intercepting sensors and the wafer boat sensors, any improperly placed wafer boat or items inside the outlet port area can be detected. Hence, collisions between a wafer boat forwarded by the stocking unit and any wafer boat or items left inside the outlet is prevented.

7 Claims, 4 Drawing Sheets

OUTLET PORT PROTECTIVE DEVICE FOR STOCKING UNIT

BACKGROUND OF THE INVENTION

1. Field of the Invention

The present invention relates to a protective device. More particularly, the present invention relates to an installation with light-intercepting sensors for detecting any improperly placed wafer boat in the outlet port of a stocking unit so that accidental collision between wafer boats is prevented.

2. Description of the Related Art

Inside a semiconductor manufacturer plant, stocking units are normally used to store wafer boats. In general, each stocking unit has two inlet ports and two outlet ports. When a wafer boat needs to be stored inside the stocking unit, the wafer boat is placed inside one of the inlet ports. After a while, the wafer boat is transported into a storage area inside the stocking unit. On the other hand, when someone needs to retrieve a wafer boat inside the stocking unit, the bar code of a desired wafer boat is fed into the master controller of the stocking unit. Once the bar code for a particular wafer boat is fed, the stocking unit automatically transfers the desired wafer boat to one of the outlet ports so that the boat can be taken away by an operator.

FIG. 1 is a top view of a conventional stocking unit used in most semiconductor manufacturing plants. As shown in FIG. 1, a conventional stocking unit 10 includes an in-stock area 12, an out-stock area 14 and a storage area 16. The in-stock area 12 has two inlet ports 18 and 20, located on the inner and outer flank of the in-stock area 12, respectively. The inlet ports 18 and 20 are areas for placing wafer boats that need to be placed in the storage area 16. The out-stock area 14 also has two outlet ports 22 and 24, located on the inner and outer flank of the out-stock area 14, respectively. The outlet ports 22 and 24 are temporary storage areas for wafer boats leaving the storage area 16.

When a particular a wafer boat needs to be stored inside the stocking unit 10, the wafer boat is put in the inlet port 18 at the outer flank of the in-stock area 12. This wafer boat will be carried to the inlet port 20 at the inner flank of the in-stock area 12 and then moved on into the storage area 16. In order to retrieve a wafer boat from the storage area 16, a bar code of the desired wafer boat must be fed into a master controller (not shown, but coupled to the stocking unit 10). The stocking unit 10 automatically pulls out the desired wafer boat from the storage area 16 and transfers the wafer boat to the outlet port 22 at the inner flank of the out-stock area 14. Ultimately, the desired wafer boat is moved to the inlet port 24 at the outer flank of out-stock area 14 for the operator to take away.

FIG. 2 is a detailed top view of one of the inlet-ports 18 of the stocking unit shown in FIG. 1. The inlet-port 20, the outlet port 22 and the outlet port 24 all have the same structure as the inlet-port 18. Here, inlet-port is used as an example, only.

As shown in FIG. 2, the inlet port 18 has four wafer boat supporters 26a, 26b, 26c and 26d for supporting a wafer boat 30. The four wafer boat supporters 26a–26d are separated from each other by a fixed distance and positioned at the corners of a square centered upon the inlet port area 18. In addition, wafer boat sensors 28a and 28b are installed on the wafer boat supporters 26a and 26c for detecting the presence of the wafer boat 30. When pressure from a wafer boat is transmitted to any one of the sensors 28a and 28b, the presence of a wafer boat is implied so that the stocking unit 10 is immediately informed.

However, due to human operational errors, it is possible for somebody to mistake the outlet port for a temporary storage area for wafer boats. Sometimes, due to the improper positioning of a wafer boat in the port areas, wafer boat sensors in the outlet port areas may not detect the presence of a wafer boat. This often leads to a collision between the wafer boat retrieved from the storage area and the misplaced wafer boat in the outlet port area. Problems caused by mishandling of the wafer boats can be illustrated with an example.

FIGS. 3A through 3D are top views of a conventional stocking unit and illustrate how damages to wafer boats can arise from human mishandling.

In FIG. 3A, two wafer boats 41 and 42 are stationed at the outlet ports 22 and 24 of the stocking unit, respectively. Other wafer boats inside the storage area 16 (not shown) and waiting to go out are stuck when the two outlet ports 22 and 24 are still occupied. To take out other wafer boats, an operator must take out the wafer boat 41 in the outlet port 24 first. If anyone needs to retrieve a wafer boat such as wafer boat 43 inside the stocking unit 10, both outlet ports 22 and 24 must be emptied.

In FIG. 3B, someone who wants wafer boat 43 takes out wafer boat 41 from the outlet port 24 and puts wafer boat 41 in the inlet port 18. Meanwhile, wafer boat 42 moves out to outlet port 24, and wafer boat 43 is now stationed in outlet port 22. In other words, as soon as the wafer boat 42 moves to the outlet port 24, the wafer boat 43 inside the storage area 16 is able to move into the outlet port 22.

In FIG. 3C, the person who needs wafer boat 43 takes out wafer boat 42 and then waits until the wafer boat has moved to the outlet port 24 before taking the wafer boat 43 out.

In FIG. 3D, the person who has taken away the wafer boat 43 now puts the wafer boat 42 back in the outlet port 24 because the wafer boat 42 belongs to somebody else. However due to the improper placement of the wafer boat 42, the wafer boat sensors 32a and 32b inside the outlet port 24 cannot detect the presence of any wafer boat. In the absence of a signal that implies the presence of a wafer boat in the outlet port 24, another wafer boat that needs to get out from the stocking unit 10 is transferred directly to the outlet port 24. Hence, the outgoing wafer boat may collide with the wafer boat 42 already inside the outlet port 24 possibly damage the wafer.

On the other hand, if the wafer boat 41 is improperly placed inside the inlet port 18, sensors 28a and 28b in the inlet port 18 are unable to detect the presence of any wafer boat. However, no harm is done because the stocking unit 10 will not respond to any input request in the absence of any wafer boat in the inlet ports 18 and 20.

SUMMARY OF THE INVENTION

The invention provides an installation for protecting the outlet port of a stocking unit. The system includes an outlet port, four wafer boat supporters, two wafer boat sensors, a first light-intercepting sensor and a second light-intercepting sensor. The four wafer boat supporters are used for supporting a wafer boat and the supporters are separated from each other by a fixed distance positioned at the corners of a square centered upon the outlet port. The two wafer boat sensors are installed on the respective wafer boat supporters at the opposite corners. The wafer boat sensors are used for detecting the pressure in the presence of a wafer boat. The first light-intercepting sensor is mounted on one side of the outlet port while the second light-intercepting sensor is mounted on the other side of the outlet port. When there is no wafer boat in the outlet port, the first light-intercepting sensor is capable of receiving light coming from the second light-intercepting sensor. Conversely, the second light-intercepting sensor is capable of receiving light coming from the first light-intercepting sensor. However, if a wafer boat is placed inside the outlet port, light is blocked by the wafer boat. According to the pressure on the wafer boat sensors and the light-intercepting conditions of the light-intercepting sensors, the stocking unit is able to determine if any wafer boat is present in the outlet port. Hence, the order whether to move any wafer boat from the storage area of the stocking unit or not can be decided more accurately. When the stocking unit notices that a wafer boat is already stationed in the outlet port, any wafer boat forwarding demand is suspended and a buzzing warning is issued. A wafer boat moves to the outlet port only after an operator has removed any blocking wafer boat from the outlet port.

By installing a set of light-intercepting sensors to detect the presence of any improperly placed wafer boat in the outlet port of a stocking unit, damages to wafers due to a collision between wafer boats or a wafer boat with other items in the outlet port can be prevented.

Accordingly, the present invention provides an installation for protecting the outlet port of a stocking unit against wafer boat collisions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
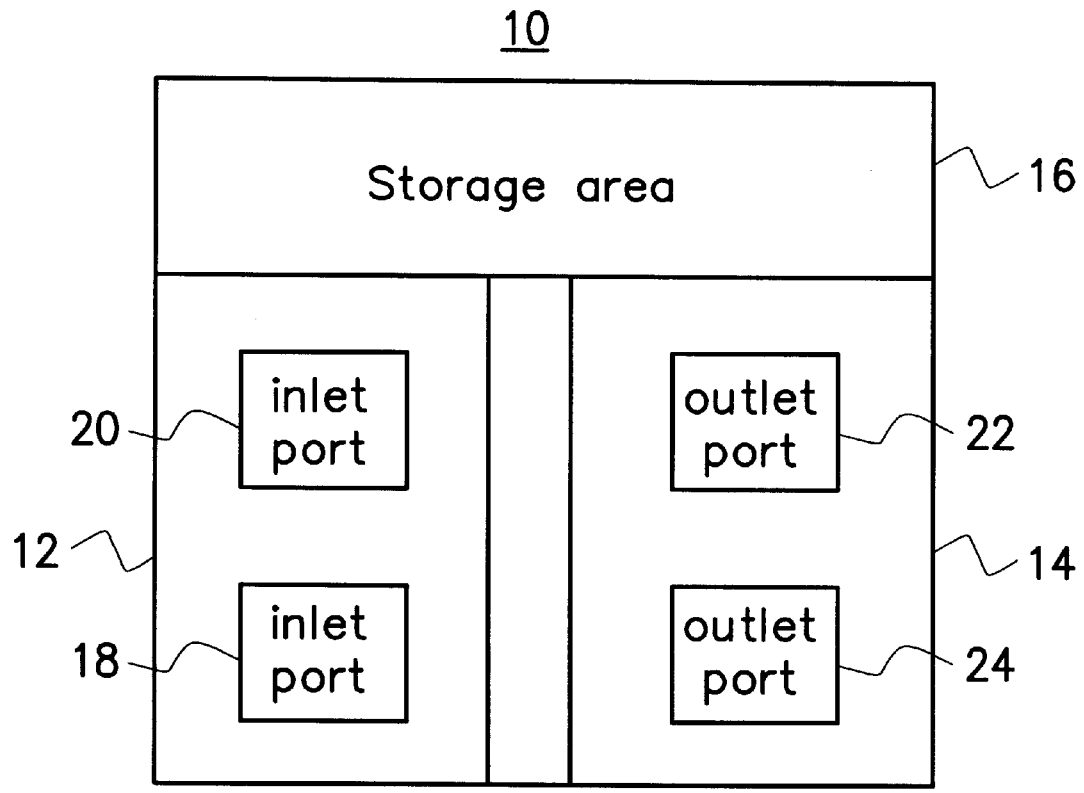
FIG. 1 is a top view of a conventional stocking unit used in most of the semiconductor manufacturing plants.
Figure 2:
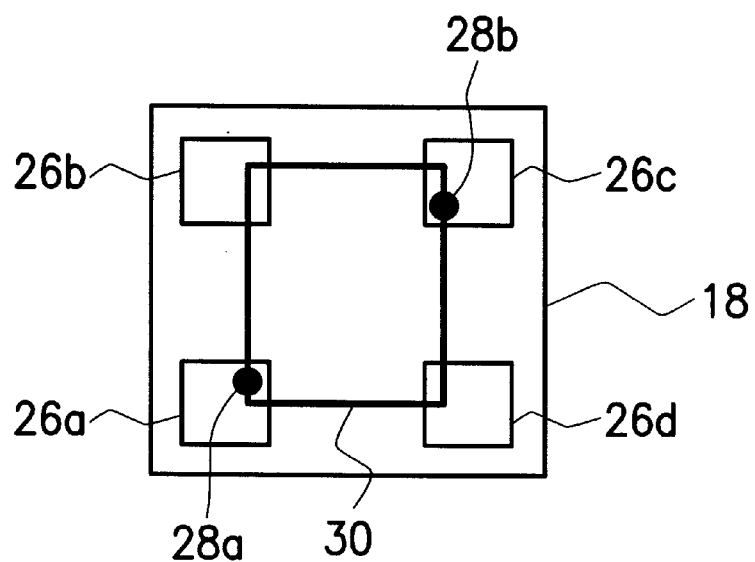
FIG. 2 is a detailed top view of one of the inlet-ports of the stocking unit shown in FIG. 1.
Figure 3A:
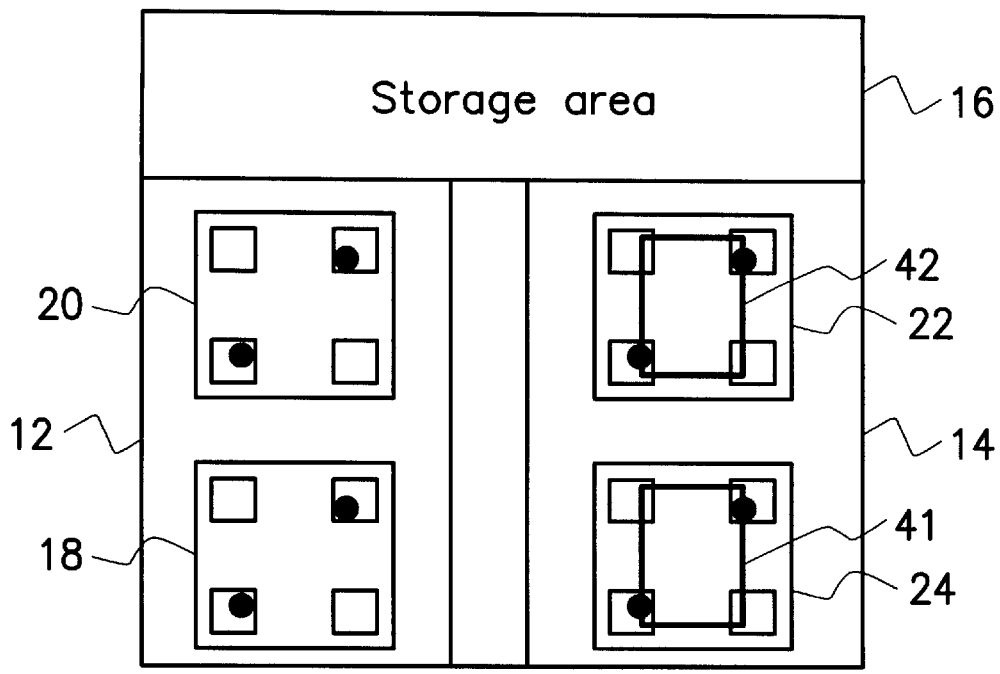
FIGS. 3A through 3D are top views of a conventional stocking unit illustrating how possible damages to wafer boats can arise from human mishandling.
Figure 3B:
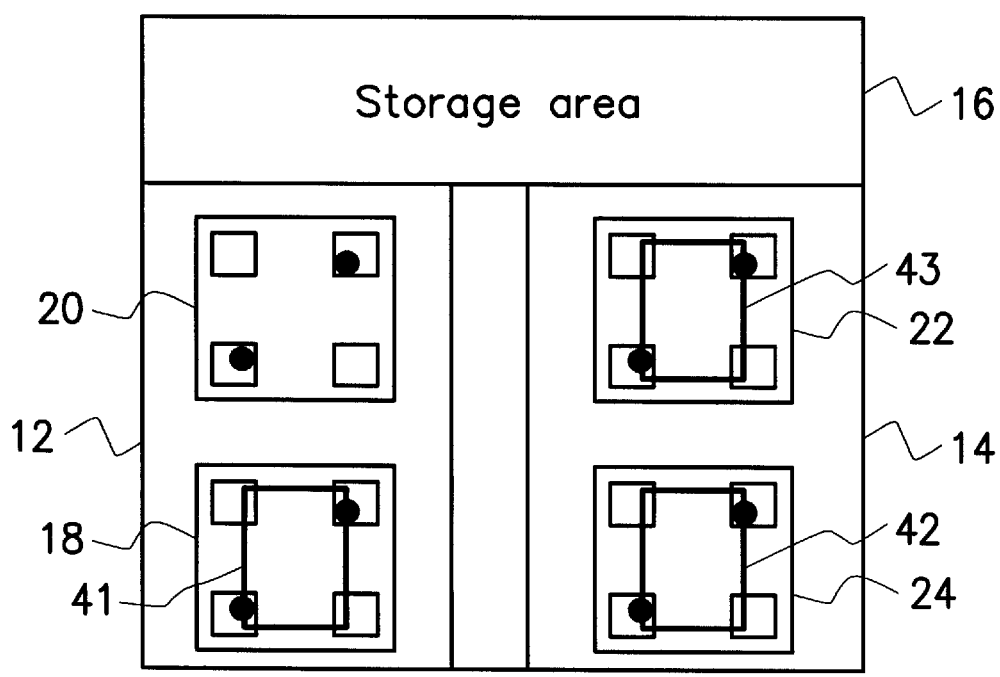
Figure 3C:
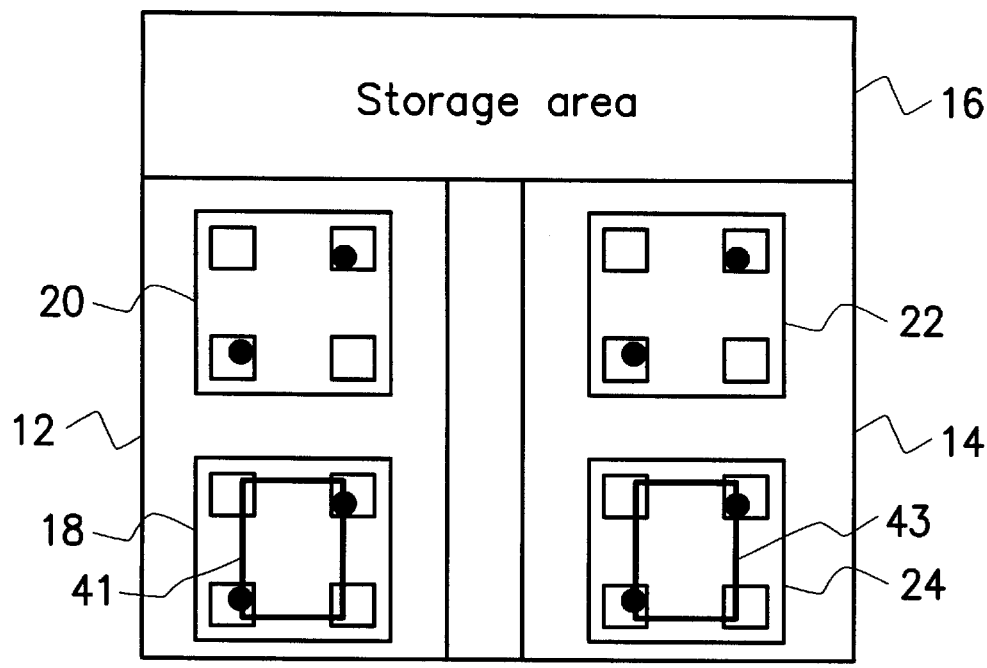
Figure 3D:
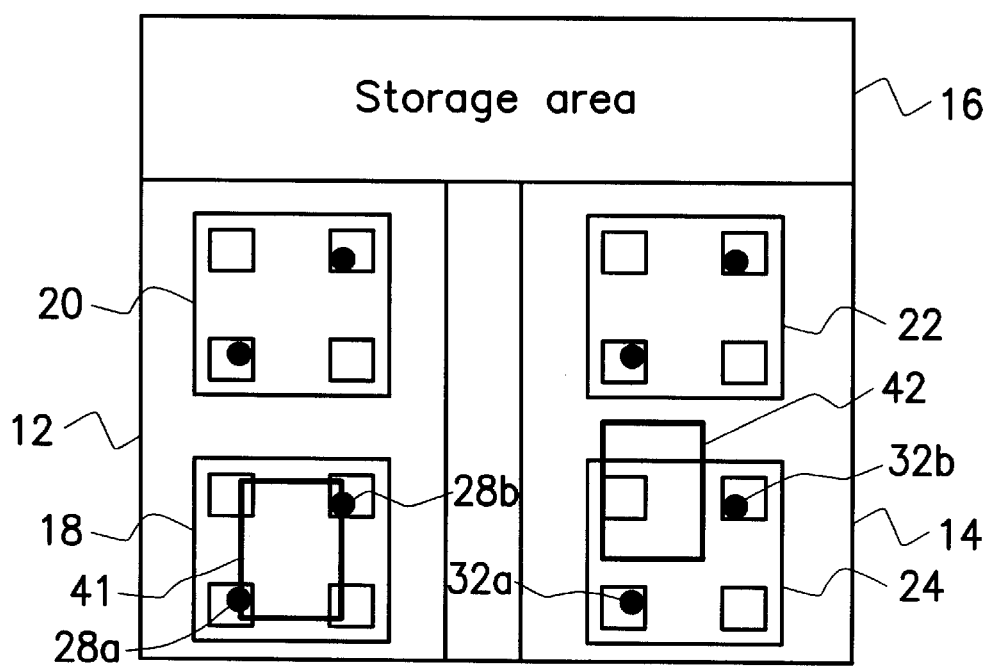

Reference will now be made in detail to the present preferred embodiments of the invention, examples of which are illustrated in the accompanying drawings. Wherever possible, the same reference numbers are used in the drawings and the description to refer to the same or like parts.

To prevent wafer boat collision due to the misplacement of another wafer boat or other items inside the outlet port of a stocking unit by an operator after the desired wafer boat is removed, a set of protective sensors are installed at the outlet port. Since the sensors are able to detect any improperly placed wafer boat or item inside the outlet port and respond by issuing a buzzing warning, the stocking unit will stop the transfer of any wafer boat to the outlet port until the outlet port is cleared.

Figure 4:
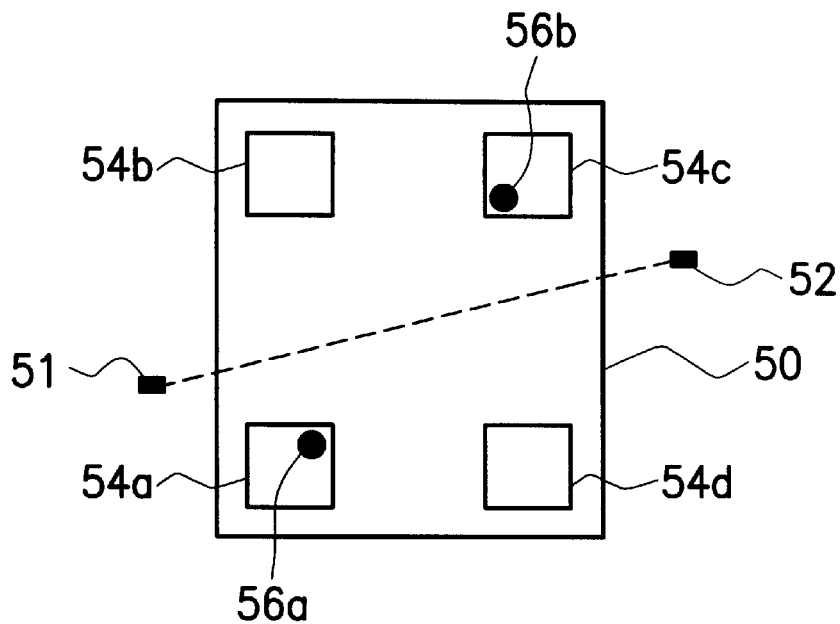
FIG. 4 is the schematic top view of a protective device at the outlet port of a stocking unit according to one preferred embodiment of this invention.
Figure 5:
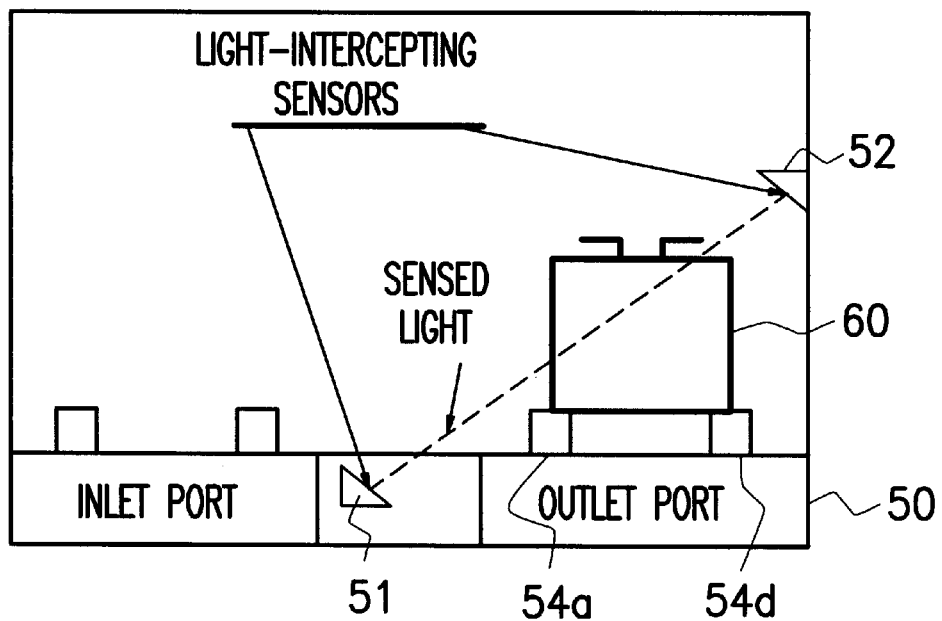
FIG. 5 is the schematic side view of the protective device at the outlet port of a stocking unit for preventing wafer boat collision according to the preferred embodiment of this invention.

FIG. 4 is the schematic top view of a protective device at the outlet port of a stocking unit according to one preferred embodiment of this invention. FIG. 5 is the schematic side view of the protective device at the outlet port of a stocking unit for preventing wafer boat collision according to the preferred embodiment of this invention.

As shown in FIG. 4, the device for protecting the outlet port of a stocking unit mainly includes two light-intercepting sensors 51 and 52 each mounted on one side of the outlet port 50 in addition to the two wafer boat sensors 56a and 56b originally on the wafer boat supporters 54a and 54c, respectively. Using the light-intercepting sensors 51 and 52 and the wafer boat sensors 56a and 56b, any wafer boat or items in the outlet port area can be detected so that wafer boat collision is prevented.

In other words the protective device of this invention includes an outlet port 50 having four wafer boat supporters 54a, 54b, 54c and 54d for supporting a wafer boat 60 (shown in FIG. 5). The wafer boat supporters 54a–54d are positioned at the corners of a square. The wafer boat sensors 56a and 56b are installed in wafer boat supporters 54a and 54c. respectively. Both the wafer boat sensors 56a and 56b are used for detecting the presence of the wafer boat 60. Similar to a conventional design, pressure on any one of the sensors 56a and 56b implies the presence of a wafer boat on the supporters 54a–54d. The presence of the wafer boat 60 is reported to the stocking unit, and a warning is sounded through a buzzer (not shown) at the same time.

Note that the light-intercepting sensors 51 and 52 are positioned on each side of the outlet port 50. As shown in FIG. 5, the light-intercepting sensor 51 is mounted on a lower left side of the outlet port 50 while the light-intercepting sensor 52 is mounted on a upper right side of the outlet port 50. Both sensors 51 and 52 are fixed inside the stocking unit.

Under normal operating conditions, or in other words, when there is no wafer boat or item in the outlet port 50, the light-intercepting sensor 51 is able to pick up light coming from the light-intercepting sensor 52 (or conversely, the light-intercepting sensor 52 is able to pick up light coming from the light-intercepting sensor 51), shown by dashed lines in FIG. 5. Hence, by reversing the argument, a blockage of light rays going to any one of the sensors 51 and 52 implies a wafer boat or some other item is improperly placed inside the outlet port 50.

For example, when a wafer boat 60 is inside the outlet port 50, no wafer boat is forwarded to the outlet port 50 because light between the light-intercepting sensors 51 and 52 is blocked. Whether the wafer boat 60 presses on none of the wafer boat sensors 56a and 56b does not matter. In addition, a warning buzz is also emitted by a buzzer (not shown) whenever this happens so that any obstacle in the outlet port 50 can be removed. Since the stocking unit transfers any desired wafer boat to the outlet port 50 only after the outlet port is cleared, collision between wafer boats or with an obstacle in the outlet port area is prevented.

In summary, the advantages of this invention includes the detection of any improperly placed wafer boat or items in the outlet port area of a stocking unit by installing a set of light-intercepting sensors. Consequently, collision between a wafer boat coming out from the storage area and an improperly placed wafer boat in the outlet port or with an obstacle in the outlet port is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An installation for protecting an outlet port of a stocking unit, comprising:

the outlet port;

four wafer boat supporters for supporting a wafer boat, wherein the wafer boat supporters are separated from each other by a fixed distance and the supporters are positioned at corners of a square centered upon the outlet port;

two wafer boat sensors mounted on two of the wafer boat supports positioned at opposite corners for sensing the pressure caused by a weight of a wafer boat;

a first light-intercepting sensor positioned on one side of the outlet port; and a second light-intercepting sensor positioned on the other side of the outlet port;

wherein when no wafer boat is in the outlet port, the first light-intercepting sensor is capable of picking up light coming in from a direction of the second light-intercepting sensor, and when a wafer boat is placed inside the outlet port, the light is blocked by the wafer boat so that the stocking unit is able to decide whether or not to forward wafer boat to the outlet port based on information provided by the wafer boat sensors and the light-intercepting sensors.

2. The installation of claim 1, wherein the protective device further includes a buzzer coupled to the wafer boat sensors so that the wafer boat sensor issues a warning signal to the buzzer for emitting a buzzing sound when a pressure is sensed by the sensor.

3. The installation of claim 1, wherein the protective device further includes a buzzer coupled to the first light-intercepting sensor so that the first light-intercepting sensor issues a warning signal to the buzzer for emitting a buzzing sound when light to the first intercepting sensor is blocked.

4. The installation of claim 1, wherein when no wafer boat is placed inside the outlet port, the second light-intercepting sensor is capable of picking up light coming in from the first light-intercepting sensor direction, and when a wafer boat is inside the outlet port area, light going to the second light-intercepting sensor is blocked.

5. The installation of claim 1, wherein the first and the second light-intercepting sensors are fixed inside the stocking unit.

6. The installation of claim 1, wherein once the stocking unit is informed about a presence of a wafer boat in the outlet port area, the stocking unit terminates any decision to forward a requested wafer boat to the outlet port area until the outlet port area is cleared.

7. The installation of claim 1, wherein the first light-intercepting sensor is positioned on one lower side of the outlet port and the second light-intercepting sensor positioned on the other upper side of the outlet port.

* * * * *